United States Patent [19]

Spechler

[11] 4,376,158
[45] Mar. 8, 1983

[54] COLOR-PROOFING METHOD

[75] Inventor: Daniel S. Spechler, Brooklyn, N.Y.

[73] Assignee: Keuffel & Esser Company, Morristown, N.J.

[21] Appl. No.: 313,424

[22] Filed: Oct. 21, 1981

Related U.S. Application Data

[62] Division of Ser. No. 795,339, May 9, 1977.

[51] Int. Cl.³ .............................................. G03C 1/68
[52] U.S. Cl. .................................. 430/291; 430/293; 430/294
[58] Field of Search ........................ 430/291, 293, 294

[56] References Cited

U.S. PATENT DOCUMENTS

| | | | |
|---|---|---|---|
| 3,060,024 | 10/1962 | Burg | 430/251 |
| 3,241,973 | 3/1966 | Thommes | 430/371 |
| 3,282,765 | 11/1966 | Pine et al. | 456/344 |
| 3,677,757 | 7/1972 | Nishizawa | 430/23 |
| 3,721,557 | 3/1973 | Inoue | 430/257 |
| 3,788,846 | 1/1974 | Mayaud et al. | 430/25 |
| 4,053,313 | 10/1977 | Fan | 430/270 |

Primary Examiner—John D. Welsh
Attorney, Agent, or Firm—Lionel N. White

[57] ABSTRACT

A method of forming a color-proofing surprint includes the image-wise light exposing of an imaging sheet having a photoresist top layer, removing by the application of developer fluid the more soluble areas remaining after light exposure, thereby revealing image-defining areas of an underlying layer of pressure-sensitive adhesive, and applying a powdered colorant to such image-defining areas of adhesive. The residual areas of the photoresist layer may then be removed to reveal the non-imaged areas of the adhesive layer and the image-bearing adhesive surface of the sheet pressed into adhesive contact with a receiving surface. Removal of the original carrier film of the imaging sheet from the adhesive layer renders this layer accessible to receive, in image registration, the image-bearing adhesive layer, in different color, of a separate imaging sheet. Repetition of the process with additional colored images renders a multi-colored surprint proof which may ultimately be affixed, by means of the final accessible adhesive surface, to any type of printing stock in order to provide a faithful example of the appearance of a press print on such stock.

8 Claims, 3 Drawing Figures

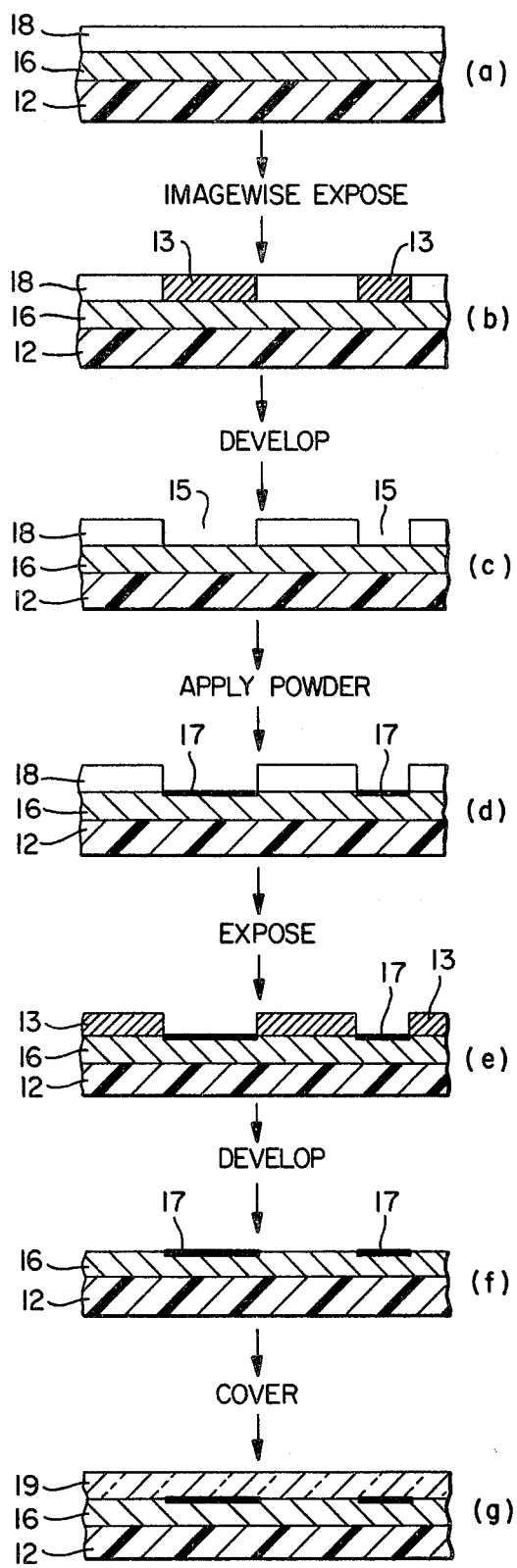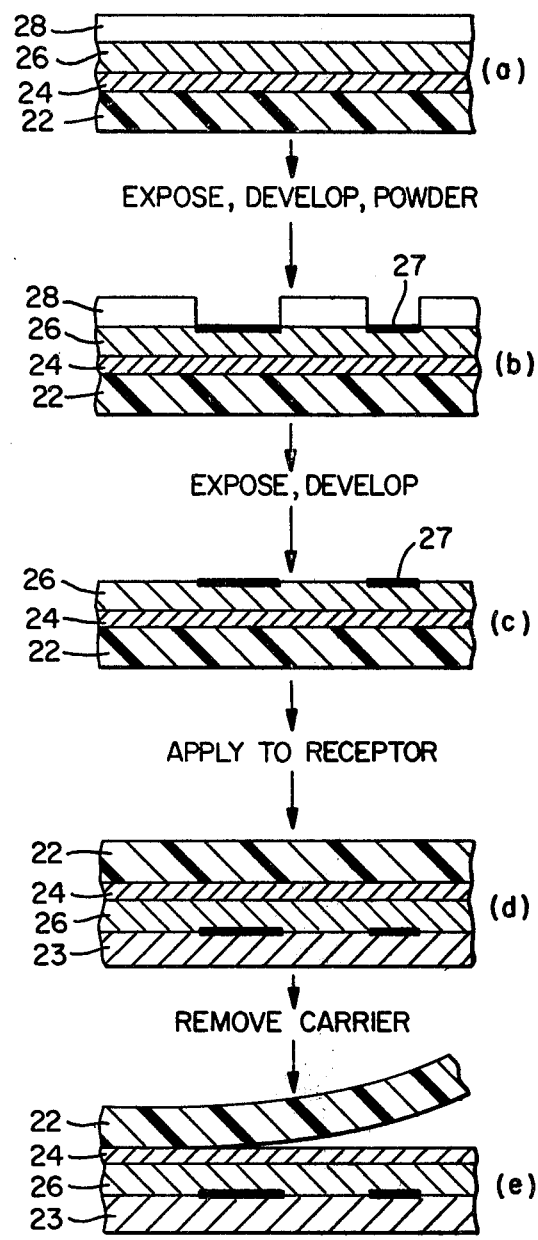
FIG. 1
FIG. 2

COLOR-PROOFING METHOD

RELATED APPLICATION

This application is a division of co-pending application Ser. No. 795,339, entitled "Color-Proofing Material and Method", filed May 9, 1977.

BACKGROUND

In the printing arts, particularly lithography, where multicolor printing is employed, it is necessary, prior to any extended printing run, to ensure the quality of the color separation negatives, or diapositives, from which the printing plates are prepared. While "proof press" practice remains significantly widespread, there has been an increase in the use of "color-proofing" materials and procedures. Contrary to the proof press methods which entail the preparation of actual printing plates for the generation of ink impression prints, the color-proofing materials provide means for the intermediate representation of the color separations which are in great measure sufficiently faithful to the separation photography to serve as indicators of the final printing impressions which might be expected from a printing run.

The more successful color-proofing materials have generally been of two types, comprising either sets of precolored or pigmented photosensitive sheets which are exposed to the set of color separation originals and processed to provide a series of colored proof images which superimposed yield a multicolor representation of the final work, or photosensitive sheet materials which are substantially colorless yet respond to photographic exposure to yield latent images which may be colored respectively with the primary hues in the form of pigments, inks, or dyes.

The former of these two types of color-proofing materials, i.e., the precolored sheets, are generally deemed less advantageous in view of the fact that the depth or intensity of color cannot readily be varied. The requirement for a large inventory of variously colored sheet materials further detracts from their utility. For these reasons it has been recognized that the proofing materials which can be employed in a post-coloring process are better adapted to the lithographer's needs in providing preliminary reproductions of the color separation originals in those tones and variations of color intensity which will be required in the final printing. The color-proofing materials and method of the present invention belong to this latter group of post-colored proofing materials.

Presently available color-proofing materials comprise for the most part a carrier sheet and a layer coated thereon of a photographic material which reacts to light exposure in such a manner that it exhibits a greater or lesser degree of solubility in developing fluids or response to other processing as between the exposed and unexposed areas. Such photographically reactive layers are generally photoresist or photopolymerizable compositions. The photographic layer of the present invention may be generally classed with the photoresist materials.

Typical of the precolored proofing materials are those positive-working napthoquinone diazide compositions of U.S. Pat. No. 3,326,682 and negative-working benzoquinone diazide photoresist compositions described in U.S. Pat. No. 3,527,604. The color-proofing sheets utilizing these compositions generally comprise a layer of the photoresist material in which is incorporated one of the pirmary color pigments utilized in the process inks of the lithographic trade. Image-wise light exposure of the layer to a color separation original results in a photolytic change in the composition of the layer such that the exposed areas of a positive-working material, for example, become more soluble in a developing fluid, such as an aqueous alkaline solution. Washing the exposed material with such a fluid removes the light-struck areas causing the remaining colored layer material to form a faithful reproduction of the color separation original. Where the carrier for each of the precolored photoresist layers is a transparent film, superposition of each of the processed color sheets yields a composite which is representative of the final print.

Other procedures for manipulating the precolored photoresist layer proofing materials have been devised wherein the assemblage of separate sheets is avoided. These include the sequential transfer of separate photosensitive colored layers from temporary carrier sheets to a receptor upon which each such layer is exposed and processed to remove soluble portions, as described in U.S. Pat. Nos. 3,671,236 and 3,728,120. Further methods, described in U.S. Pat. Nos. 3,721,557 and 3,764,318, entail the exposure and development of each color separation print on its respective carrier prior to transfer of the resulting color images to a final receiving sheet, in sequence and proper registry with each of the other proof images of the set.

Among the post-colored proofing materials which, as earlier noted, provide the lithographer with more latitude in the preparation of proofs of varying color intensity and hue are those described in U.S. Pat. No. 3,060,024 where a photopolymer exposed to render light struck areas less tacky under applied heat is developed by the application of a finely-divided process pigment, the pigmented image being transferred with heat to a receptor sheet in register with other prints of the set, and in U.S. Pat. No. 3,634,087 where a diazo resin layer, exposed to a color separation original, is developed with an alkaline fluid to remove unexposed areas and yield an image which is colored with an ink/lacquer emulsion, the imaged proof sheet then being superimposed in registry upon other proof sheets of the set.

The color-proofing materials of the present invention, in providing for the post-coloring of exposed sheet material, avoid the noted disadvantages of those precolored or predyed sheets which have been in prior use. Further, the present materials provide the lithographer with latitude in the preparation of images of varying color intensity, and still further, provide for precisely registered compositing of multi-color images on a single sheet, thereby avoiding the excessive thickness and registry problems associated with separate sheet overlays. The present material and process also exhibit the notable advantage of enabling the preparation of composite transparency images, as well as surprint images on opaque papers and sheet materials of any stock upon which the final lithograph is intended to be imprinted.

SUMMARY

The sheet material useful in the present color-proofing method consists essentially of a carrier web, such as paper or plastic film; a coating on such carrier of a layer of a pressure-sensitive adhesive exhibiting at least a significant degree of adhesive attraction for dry powdered pigments, dyes, or dusts, and an overlying coating substantially coextensive with the pressure-sensitive adhesive layer of a photoresist material which undergoes a photolytic change in solubility with respect to a developing solution in those areas which are exposed to light. While other embodiments of the invention including adjunctive layers and components will be described below, the essential elements of the color-proofing material consist of the carrier, the pressure-sensitive adhesive layer, and the photoresist layer.

This simplest embodiment of the color-proofing material may be employed directly to obtain a basic proof of a color separation negative in the following manner. By placing the photoresist layer surface of the material in close contact with a color separation original and exposing the combination to actinic radiation which effects a change in the solubility of the photoresist material, a latent image is created in the color-proofing sheet. Depending upon the type of separation original employed, that is, a negative or diapositive, a photoresist material is used which will become, or remain, more soluble in areas representative of the greater abundance of the separation color in the original subject matter. Thus, when employing a direct negative separation original, the photoresist layer is positive-working and will become more soluble in respect of a developing solution in light exposed areas. Conversely, a negative-working photoresist layer is employed when proofing by means of a positive transparency of the original color scene.

Post-exposure application of an appropriate developer solution, for example an aqueous alkaline solution when employing readily available quinone diazide type photoresist compositions, followed by a washing and drying, will effect removal of the photoresist layer in those areas of the latent image rendered the more soluble by the photolytic effect of the exposure. There then remains in the proofing sheet the exposure image pattern in the form of "open window" areas in the resist layer which reveal the pressure-sensitive adhesive layer in the form precisely representative of the primary color attributable to the separation original.

Coloration of that image may then be effected by wiping over the resist surface of the material with a powdered pigment of the appropriate primary separation color in such a manner as to ensure thorough contact of the pigment with at least the open window areas of revealed pressure-sensitive adhesive. Wiping away the excess pigment powder yields a precise representation of the separation original in the form of primary color pigment adhering to the initially accessible areas of the adhesive layer.

While the proof image on the sheet at this stage of processing is for the most part sufficient as an indicator of the quality of the separation original, further processing may be employed to enhance the image and improve the resistance of the imaged sheet to abusive handling. Thus, the imaged sheet may be re-exposed over the whole of the remaining photoresist layer surface to sufficient of the original actinic radiation to render those layer parts soluble in the developer solution. Application of the developer followed by rinsing and drying removes the residual photoresist material, along with whatever extraneous pigment there may be clinging to the layer, and results in the proofing sheet assuming a form wherein the pigment image resides upon a background of pressure-sensitive adhesive. These adhesive areas are then employed to affix over the surface of the pigment image a thin transparent protective sheet, such as a plastic film. The proof image may then be manipulated without fear of displacement or marring of the precise image reproduction.

Another embodiment of the present invention provides sheet material which may be used in a proofing process whereby the pigment-imaged layer may be transferred to a receptor sheet which is precisely the stock upon which the final printing run is to be made. Not only does this procedure enable the lithographer to generate a more realistic representation of the final print, it also enables the structuring of multi-colored proofs by the sequential transfer to the receptor of each of the various process color proof images.

In such an embodiment the carrier sheet of the proofing material is selected or prepared such that the surface upon which the pressure-sensitive adhesive is coated exhibits low adherend, or abherent, properties with respect to the adhesive material utilized. For this purpose there may be selected plastic films, such as polyolefins or polyethylene terephthalate, which naturally exhibit the low adherend property, or other sheet materials, such as paper, may be coated with compositions such as the silicone resins commonly used in the preparation of release sheets in pressure-sensitive adhesive product manufacture. Utilizing such carrier sheets having abherent release surface properties, one is able, after formation of the pigment image and removal of residual photoresist material, to transfer the imaged adhesive layer to the selected receptor sheet material merely by the application of pressure without reliance upon heat or fluid processing to obtain such transfer.

In a further embodiment of the proofing sheet material there may be coated an interlayer of a non-tacky resin material between the release surface of the carrier and the adhesive layer to serve as a stripping layer and to render the final print upon the receptor sheet non-tacky and resistent to handling. Any suitably compounded polymeric material, such as a lightly plasticized polyvinyl alcohol or polyvinyl acetate coating, may serve as such a protective stripping layer.

The pressure-sensitive adhesive materials suitable for use in the preparation of proofing sheets of the present invention may be compounded from numerous readily available resinous and polymeric materials. Included among these are natural rubbers, vinyl polymers and co-polymers, and synthetic elastomers, such as polyisobutylene and vinyl ether compounds. The degree of tack exhibited by the pressure-sensitive adhesive may be readily varied according to well-known compounding practices by the addition of plasticizers and tackifiers, such as esterfied rosins or short chain resins, or by the blending of polymers and elastomers of varying molecular weight and natural adhesive tack properties. Such compounding and the extent of tack derived in the adhesive composition will, of course, be guided by the type of carrier sheet or release layer used and by the range of receptor surfaces anticipated.

The colored powders utilized on the developed adhesive image may be any finely-divided pigment or dye and will be preferably selected from those pigments utilized in the preparation and compounding of the process ink products of the lithographer's trade. Particularly suitable are those pigment powders described in U.S. Pat. Nos. 3,620,726 and 3,909,282. The present sheet materials may also be used to prepare special purpose images through the use of such functional powdered compositions as magnetic oxides, hectographic dyes, and the like.

Although the proofing materials of the present invention are in effect negative-working, that is, capable of providing a positive reproduction identical to the finished printing work upon exposure to a first generation color separation negative, the photoresist materials utilized in the preparation of the color-proofing sheet are selected from the so-called positive-working compositions. These photoresist preparations respond photolytically to exposure to actinic radiation by becoming more susceptible in the light-struck areas to the solvent effect of developer solutions. Particularly suitable positive-working photoresist materials are those compositions comprising combinations of napthoquinone diazide compounds and novolak resins, as described in U.S. Pat. Nos. 3,201,239 and 3,326,682. As therein described, these photoresist materials are readily dissolved away in light-struck areas by the application of mildly alkaline aqueous solutions of such compounds as the alkali metal silicates or phosphates.

It will, of course, be recognized that, if desired, the proofing sheet material of the present invention may be prepared with truly negative-working photoresist materials, such as the benzoquinone diazide compositions described in U.S. Pat. No. 3,527,604, in order to yield materials which will respond to the application of alkaline developer solutions by dissolution and removal in areas which have not been exposed to actinic radiation. The use of such negative-working photoresists are not preferred, however, since there is initially required the preparation of a second generation color separation diapositive in order to effect proper light exposure of the material, and, further, since removal of residual photoresist layer material subsequent to the application of pigment powder entails the use of harsh solvents and more extended processing as compared with the ready removal of the positive-working resists by simple exposure and redevelopment in the alkaline solution.

DRAWINGS

The essence of the present invention will be seen in the accompanying drawings, of which:

FIG. 1 shows the simplest embodiment of a color-proofing sheet material according to the invention along with the sequential processing steps utilized to obtain a proof image;

FIG. 2 shows another embodiment of the instant proofing sheet material with processing steps to prepare a single-color transfer image.

DESCRIPTION

Figure 3:
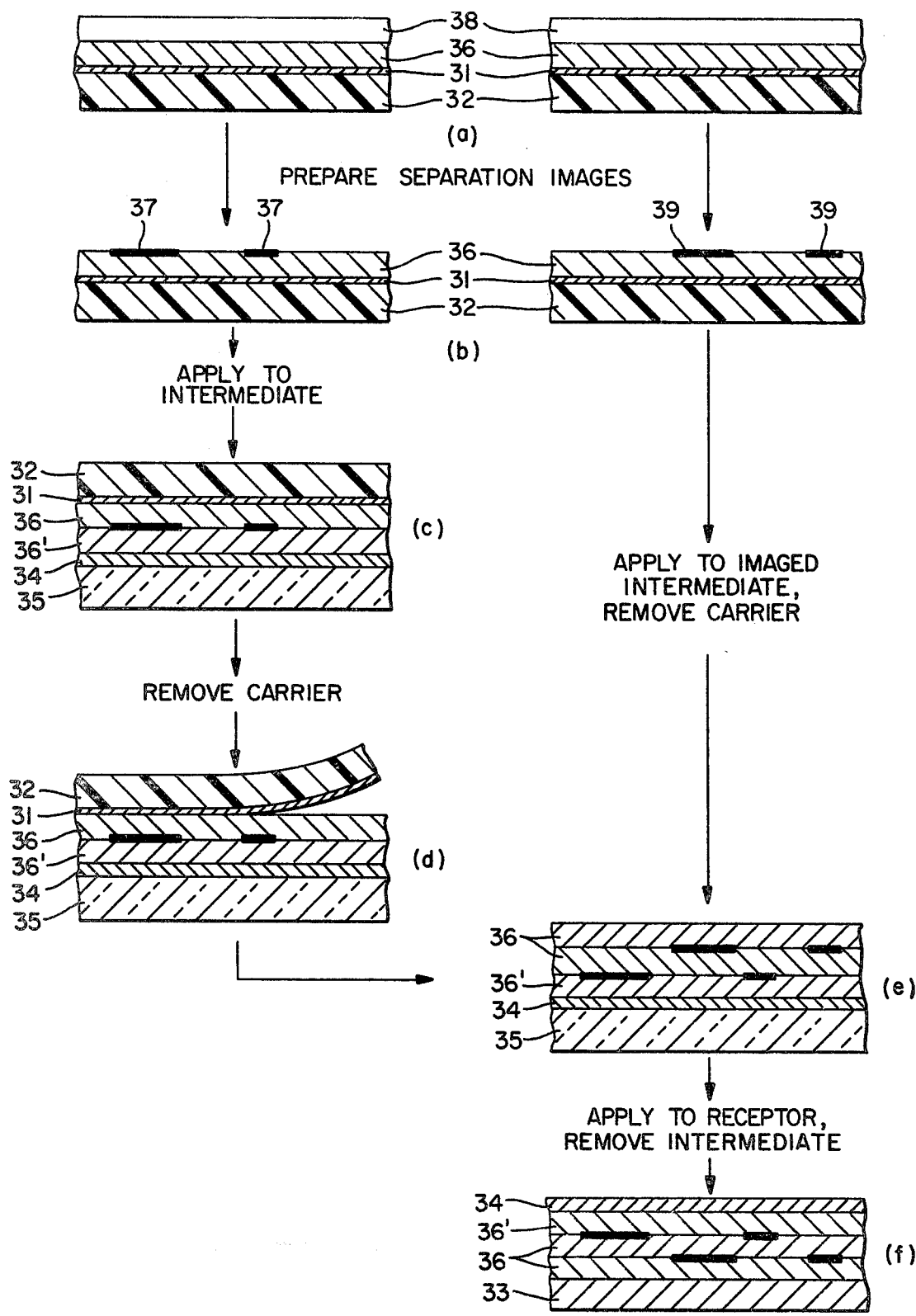
FIG. 3 shows yet another embodiment of the sheet material of the present invention along with processing steps for the preparation of multi-color proof images.

The basic structure of the color-proofing sheet material of the present invention consists essentially of three elements, i.e. carrier, pressure-sensitive adhesive layer, and a layer of photoresist material. Such a sheet material and the method of utilizing such material for the preparation of a simple single-color proofing image may be seen in FIG. 1.

The color-proofing sheet consists of a carrier sheet 12 of paper or plastic upon which is coated a layer of pressure-sensitive adhesive 16. An overlayer 18 of a positive-working photoresist composition which is substantially co-extensive with adhesive layer 16 completes the proofing sheet structure.

The various operations in the processing of such color-proofing material being with an image-wise exposure of the photoresist layer 18 to actinic radiation, such as ultraviolet light, through a color separation negative. Since, as will be seen in steps (f) or (g), it is intended to retain the color image on the surface of carrier 12, exposure will preferably be effected with the emulsion side of the separation negative in direct contact with the photoresist surface of the color-proofing sheet material. In this manner there will not only be obtained a right-reading color print on the sheet, but there will also be avoided exposure parallax which would otherwise result from the dispersion of actinic radiation in the body of the carrier of the photographic emulsion.

The photoresist composition being positive-working, areas 13 of photoresist layer 18 upon which the actinic radiation was incident are rendered more soluble to developing fluids. The exposed material is thus developed by an overall application of a developer solution to the surface of photoresist layer 18 and, with a light swabbing with a cotton pad and rinsing, the light-struck portions 13 of layer 18 are removed to reveal open-window areas 15 in the photoresist layer. In the present processing there may be employed for developing a weakly alkaline aqueous solution of, for example, an alkali metal phosphate. Drying of the developed material with circulating air yields a sheet, as at stage (c) in the processing, in which portions of the pressure-sensitive adhesive layer 16 are accessible through the open areas 15.

After development the sheet material is colored by the application of powdered pigment of the appropriate process color represented in the separation negative used in the exposure step. A light wiping of the pigment powder over the whole imaged surface of the sheet material allows those portions of the pressure-sensitive adhesive layer 16 which have been made accessible through the open areas of the photoresist layer 18 to take on a surface coating of the pigment powder which is retained by the adhesive properties of layer 16 to form the colored image areas 17, as shown at (d).

At this stage in the processing, the proofing sheet material appears as the positive duplicate of the color separation negative and is a sufficiently faithful reproduction of the negative to allow a qualitative examination, for example, of the formation of screening dots. Since some extraneous pigment powder will normally cling to the outer surface of the photoresist layer 18, however, there may be some lack of true color discernment due to this "fogged" background. Should such a background coloration be of significant concern to the lithographer, the remaining process steps may be effected to clear the background of the image.

Exposure of the whole surface of the remaining photoresist layer to the actinic radiation renders that composition more soluble, as at 13 in step (e). Overall application of the developer solution then dissolves away the remaining photoresist layer to yield an imaged proofing sheet which consists essentially of the carrier sheet 12 having an overall layer of substantially transparent pressure-sensitive adhesive 16 in which is imbedded pigment powder image 17, as seen in processing step (f). In order to protect the powder image from the handling which will take place during a thorough proof examination, a cover sheet of transparent film 19 may be applied over the surface of the imaged material to be retained in place by the accessible background of pressure-sensitive adhesive layer 16.

Depending upon the type of carrier sheet initially utilized, that is whether opaque paper or transparent plastic film, the finished print may be viewed directly or placed against the background of a sheet of the color which will be employed in the final lithograph print. Further, the proof image prepared on material having a transparent carrier 12 may be used with similar imaged sheets of the other colors of the separation negative set and assembled in register to provide a composite multi-color reproduction of the final lithograph print. It should be noted, however, that such an overlay multi-color duplicate is not a preferred manner of using the proofing materials of the present invention, since variant embodiments and related processing steps, to be described below, will yield multi-color proof prints of much higher quality and integrity.

Another embodiment of the present invention is shown in FIG. 2 which, at (a), shows a color-proofing sheet material comprising a carrier 22, such as a polyethylene terephthlate film having a surface of low adherend properties upon which there is coated a thin layer of a film-forming polymeric material; for example, a high molecular weight polyvinyl alcohol which adheres only lightly to the carrier surface. This coating serves as a stripping layer 24 for the subsequent coated layers of the proofing material; namely, pressure-sensitive adhesive composition 26 and a co-extensive overlayer of photoresist 28.

In the manner earlier described with respect to FIG. 1, the proofing sheet is exposed, developed, and powdered with a dry pigment of the appropriate process color represented in the color separation negative to form a powder image 27 on the adhesive layer 26. Further exposure to the actinic radiation employed in the image-wise exposure of the sheet followed by application of the developer solution effects the removal of residual photoresist composition to yield the imaged adhesive layer material shown at FIG. 2(c).

By the interposition of the stripping layer 24, the proofing sheet has been adapted to effect a ready transfer of the imaged adhesive layer 26 to a selected receptor sheet. By such a transfer the image will be reversed; however, since the primary use of this structure of color-proofing material is for the initial examination of separation negative quality, the color print need not be right-reading and will, as earlier noted, be more effectively formed if exposed with the emulsion surface of the negative in direct contact with the photoresist surface of the color-proofing sheet material.

The pressure-sensitive adhesive surface of layer 26 in the proof image thus formed is applied with pressure, for example under a roller, to the surface of an appropriate receptor sheet 23. Depending upon the intended purpose of the final proof image, receptor sheet 23 may be a transparent film, in which event the final print will take the form of a color transparency; or a surprint may be formed with a receptor sheet 23 of an opaque material such as paper, foil or the like. It is in this formation of surprint images that the material and method of the present invention is superior to the materials previously available. Unlike those other processes, with the present invention a receptor sheet of substantially any conformation may be employed and will provide the lithographer with the capability of utilizing the very sheet material upon which the printing is to be applied, thus yielding a particularly true representation of the final print job.

As a final step in the procedure of forming a transfer proof print with the instant materials, carrier sheet 22 is separated from stripping layer 24, as shown at stage (e) of FIG. 2, to yield a final proof which has incorporated a protective outer layer on the imaged adhesive layer 26 in the form of stripping layer 24.

Yet another embodiment of the present invention and a method of forming multi-color proofing images therefrom are shown in FIG. 3. The processing represented here entails the use of two proofing sheets to obtain a final two-color composite, yet it will be readily understood that repetiton of the described procedure with third and fourth separation proof imaged sheets will yield the traditional 3- or 4-color proof composite.

A pair of identical sheets of proofing material, prepared in accordance with the instant invention, are shown at stage (a) of FIG. 3 and comprise a carrier sheet 32 to which is bonded a thin layer 31 of release material, such as a polysiloxane resin. Coated upon this prepared carrier sheet are the pressure-sensitive adhesive layer 36 and the overlayer of photoresist 38. In the manner previously described, each of the proofing sheets is exposed to actinic radiation through a different one of the separation negatives of the set and are then developed, colored with the appropriate process pigment, and further processed to remove the residual photoresist materials to yield the pair of proof sheets shown at stage (b) carrying the images 37 of, for example, magenta and 39, of cyan. At this stage additional proof sheets will bear appropriate images in yellow and black if it be intended to form a four-color proof.

It will be apparent from the subsequent depicted steps in the processing to form the multi-color composite that each of the imaged adhesive layers are tansferred in turn to an intermediate sheet, as at (c), which comprises a carrier 35, a polymeric film stripping layer 34, and to facilitate reception of the initial image layer, a coating of pressure-sensitive adhesive 36'. Since the composite multi-color image will ultimately be transferred to a selected printing stock as the final receptor, there will be effected a transposition, in the reading sense, of the image composite; therefore, the more advantageous face-to-face combination of proofing sheet and separation negative may be utilized during the image-wise exposures.

The transfer of images to the intermediate sheet follows the steps generally described earlier and as shown here at (c) where the first imaged sheet is contacted under pressure with the respective adhesive surfaces 36,36' in face-to-face relationship followed, at (d), by removal of the first carrier sheet 32 and its adhered release layer 31. Similar transfer of the adhesive layer of the second sheet bearing pigment image 39 to the now fully accessible adhesive layer 36 of the first imaged layer with removal of the second carrier sheet and release layer yields the two color print shown at stage (e).

The final step in the processing of the multi-color proof print is transfer of the multi-color composite to a selected receptor sheet 33, which may be, as earlier noted, a transparent film or the paper, foil or other web material which is to be used in the actual printing operation. Contact, under pressure, of the outermost adhesive layer 36 of the multi-color composite on the intermediate sheet with the surface of the selected receptor sheet followed by removal of the intermediate carrier 35 results in the formation of the final print, as at (f), with the overlying stripping layer 34 protecting the composite proof.

PREFERRED EMBODIMENTS

In the following examples there are more specifically described typical representatives of some preferred embodiments of the present invention.

EXAMPLE 1

A sheet of 100 $\mu$m thick clear, oriented polyethylene terephthlate film was coated with a uniform layer of about 3 $\mu$m thickness from a solution of 10 parts by weight of an 11% solids solution of natural rubber in hexane (a graphic arts rubber cement marketed by Union Rubber & Asbestos Co. of Trenton, NJ under the trademark, BEST-TEST) dissolved in 100 parts by weight of butyl acetate. The coating was air-dried at ambient temperature and was overcoated to a dry thickness of about 7 $\mu$m with a composition of 30 parts by weight of a positive-working napthaquinone diazide sensitized novolak resin (marketed by Shipley Chemical Co. of Newton, MA under the trade designation, AZ-111) dissolved in 70 parts by weight of ethyl acetate. The photoresist coating was air-dried at ambient temperatures and the resulting sheet, as depicted in FIG. 1(a), was placed in a vacuum frame in contact with a color separation negative and exposed to the radiation of a carbon arc through the negative at a distance of about 300 mm for one minute. The exposed sheet material was then developed by application of a 0.25 N aqueous sodium hydroxide solution with light swabbing with a cotton pad. The light-struck areas of the photoresist layer were softened and removed by this application of developer and were thoroughly cleansed away by a rinse with tap water at about 29° C. After the sheet was air-dried at ambient temperature, a finely-divided carbon black powder was wiped over the photoresist layer surface with a cotton pad and excess powder was wiped off with a clean cotton pad. There then remained on the sheet a clear positive reproduction of the color separation negative, as seen at FIG. 1(d).

The photoresist surface of the sheet was then exposed overall to the carbon arc radiation for about one minute and washed with the alkaline developer solution, rinsed and dried to yield a sharply-defined black image on a clean, transparent background which exhibited some slight tackiness. The imaged sheet was then divided into two parts and over the adhesive surface of the first part there was applied, under rolling pressure, a 30 $\mu$m thick film of a transparent acetate film to yield a black image transparency, as in FIG. 1(g), substantially immune to handling during examination. The second portion of the imaged film was applied, under pressure, in face-to-face contact with a sheet of white bond paper coated with a 15 $\mu$m thick layer of the natural rubber adhesive composition described above. The polyethylene terephthlate carrier sheet 12 (FIG. 1) of the proofing material was then peeled from the imaged adhesive layer to yield a black positive image of the separation negative on a white paper background. In such form the imaged sheet is in condition to receive the transfer in register of images of other process colors which may be prepared in the foregoing manner utilizing others of a set of separation negatives.

EXAMPLE 2

A 75 $\mu$m sheet of oriented polyethylene terephthalate film was coated to a dry thickness of about 5 $\mu$m with a 2.5% solution of polyvinyl alcohol (marketed by Monsanto Chemical Company as Gelvator 20-30) in a mixture or equal parts of water and ethyl alcohol. On this stripping layer the natural rubber adhesive solution of Example 1 was coated to the dry thickness of about 5 $\mu$m. An overlayer of a naphthaquinone diazide sensitized novolak resin type photoresist composition, such as described in U.S. Pat. No. 3,201,239, was then applied to a dry thickness of about 4 $\mu$m to yield a colorproofing sheet of the structure depicted in FIG. 2(a).

The sheet was exposed for about 20 seconds through a half-tone color separation negative to the light of a 500 watt mercury vapor lamp from a distance of about 0.5 m. The exposed sheet was then developed by the application of a 15% solution of trisodium phosphate to remove the exposed portions of the photoresist layer. Following a water wash and air-drying, the adhesive image revealed in the open-window areas of the photoresist layer was colored by application of a commercially available blue pigment powder (marketed by E. I. duPont de Nemours and Company as Cromalin cyan toner). Overall exposure of the remaining photoresist material of the sheet and application of the developer solution cleared away this residual layer and the small amount of pigment clinging to its surface to yield a sharp positive reproduction of the half-tone negative in a process cyan color. The sheet was at this stage in the form represented in FIG. 2(c).

The imaged adhesive surface of the proofing sheet was pressed into intimate contact with the surface of a sheet of good quality printing paper which had previously been uniformly coated with a layer of the natural rubber adhesive solution to a dry thickness of about 2 $\mu$m. The carrier film of the proofing sheet was then peeled from the polyvinyl alcohol stripping layer to yield a process cyan positive reproduction of the separation negative on the printing stock providing a faithful representation of the cyan print to be obtained in the final press run. The overlying stripping layer provided the imaged layer with resistance to handling during examination.

EXAMPLE 3

A 75 $\mu$m sheet of polyethylene terephthalate polyester film was provided with a release layer by whirl coating at 600 rpm, drying, and curing in circulating air

| | | |
|---|---|---|
| Silicone reactive polymer, 30% in xylene (Syl-Off23 - Dow Corning) | 2. | gm |
| Silicone reactive polymer (Syl-Off1107 - Dow Corning) | 0.3 | gm |
| Curing catalyst (Catalyst 23A - Dow Corning) | 0.15 | gm |
| Xylene | 2.9 | gm |
| Hexane | 5. | gm |

The carrier sheet thus formed was whirl coated at 700 rpm with an adhesive solution of the following composition and dried in a circulation air oven at 80° C. for about five minutes:

| | | |
|---|---|---|
| Polyisobutylene (MW 100,000) (Vistanex MML-100 - Exxon Chemical Co.) | 20. | gm |
| Polyisobutylene (MW 10,000) (Vistanex LM-MS - Exxon Chemical Co.) | 20. | gm |

The adhesive layer was then whirl coated at 700 rpm with a solution of the following composition, prepared in an opaque glass vessel, and air-dried for about five minutes at 80° C.:

| Naphthquinone-(1,2)-diazide-(2)-5-sulfonic acid diester of bisphenol A | 0.25 gm |
|---|---|
| Cresol-formaldehyde novolak resin (FRS 696 - Schenectady Chemicals Inc) | 1.0 gm |
| Ethyl acetate | 9.0 gm |

The resulting sheet, as depicted in FIG. 3(a), was exposed through a half-tone color separation negative to the mercury vapor lamp radiation in a commercial vacuum frame plate printer for about 30 seconds and was then immersed for amout two minutes in a developer comprising a 10% aqueous solution of equal parts trisodium phosphate and sodium carbonate. The sheet was then washed with tap water to remove light-struck areas of the photoresist composition and dried.

A commercially available black process pigment powder was wiped over the surface of the developed sheet to yield a positive reproduction of the separation negative. Overall exposure to the ultraviolet light followed by application of the developer solution, washing and drying resulted in a sharply imaged sheet, as depicted in FIG. 3(b).

A second polyester film sheet was coated in a manner similar to the first sheet with a silicone resin release layer and a layer of pressure-sensitive adhesive from a solution of the following composition:

| Polyisobutylene (MW 100,000) | 18. gm |
|---|---|
| Polyisobutylene (MW 10,000) | 22. gm |
| Hexane | 360. gm |

The sheet thus prepared is capable of being utilized as an intermediate receptor sheet for the temporary transfer of imaged adhesive layers. The slightly increased ratio of lower molecular weight elastomer in the pressure-sensitive adhesive composition applied to this intermediate carrier ensures the preferential separation at the release layer/adhesive layer interface of the imaged proofing sheet during transfer to the intermediate sheet.

The imaged adhesive layer of the proofing sheet material was pressed under a roller into contact with the adhesive surface of the intermediate sheet and the proofing sheet carrier film was stripped from the composite structural leaving the underlying surface of the imaged adhesive layer accessible. That adhesive surface was then pressed firmly into contact with the surface of a good quality paper printing stock to effect adherence of the composite structure to the printing stock. Subsequently, the intermediate carrier sheet was stripped from the imaged layer and the exposed adhesive layer of the proof print was overlaid under pressure with a thin protective film of acetate. This use of an intermediate sheet is preferred whenever a proof image is transferred to a final receptor stock, since the process of such a transfer recovers the right-reading qualities of the final print which are lost through the preferred face-to-face mode of light exposure.

EXAMPLE 4

A 75 μm polyester film was coated with a solution of the following composition using a 250 μm wire wound doctor bar at a speed of 15 m per minute and dried and cured at a temperature of 105° C. for about 90 seconds to form on the surface of the film a well-adhered release coating:

| dimethyl polysiloxane, 30% in xylene (SS-4164, General Electric) | 205. gm |
|---|---|
| Curing catalyst (SS-4163c, General Electric) | 7.2 gm |
| Toluene | 665. gm |
| Hexane | 665. gm |

The resulting carrier sheet material was coated with a solution of the following composition at a web speed of about 3 m per minute using a bead coat applicator roller operating at about 3 m per minute followed by drying at 95° C. for about five minutes to form the pressure-sensitive adhesive layer of the proofing sheet:

| Polyisobutylene (MW 100,000) | 160. gm |
|---|---|
| Polyisobutylene (MW 10,000) | 160. gm |
| Hexane | 1600. gm |
| Heptane | 6088. gm |

A final meniscus coating of a commercially available positive-working novolak resin type photoresist sensitized with a naphthaquinone diazide (AZ:111, Shipley Chem. Co.) diluted to about 4% solids with ethyl acetate was applied over the pressure-sensitive adhesive coating and dried at 95° C. for about three minutes to yield the finished color-proofing sheet material.

An intermediate transfer sheet was prepared by whirl coating a 350 μm matte surface polyester film at 300 rpm with a solution of the following composition followed by drying at 95° C. for about five minutes:

| "Nylon 6" polyamide resin (BCI Nylon 637) | 2. gm |
|---|---|
| Methanol | 18. gm |
| Isopropanol | 20. gm |

The stripping layer thus formed was overcoated in a whirl coater at 300 rpm with a triple layer of the polyisobutylene solution described above and dried for about five minutes at 95° C.

Four individual sheets were taken of the photoresist material and, along with the intermediate sheet, were edged-punched in the usual manner for use in a pin-type registering device. Each of the four color-proofing sheets were exposed in a commercial mercury vapor lamp plate-making vacuum frame device in registered face-to-face contact with prepunched separation negatives. All four registered assemblies were exposed at the same time for a duration of about 20 seconds. Each exposed proofing sheet was then developed in a commercially available aqueous photoresist developer solution (marketed by Keuffel & Esser Company, Morristown, NJ as Cat. No. 58-2365) at pH 12.5, washed and dried as earlier described. The following color pigments were applied to the respective developed proofing sheets and the sheets were then overall exposed, redeveloped, and dried to yield the finished positive separation prints:

Black: carbon black powder (Raven 16—Cities Service Co.)
Cyan: beta-phthalocyanine blue powder (Irgalite Blue LGID—Ciba-Geigy)
Yellow: metaxylidide bis-acrylamide yellow powder (CI Pigment Yellow 13)

Magenta: calcium lithol rubine powder (CI Pigment Red 57)

As depicted in FIG. 3, the black imaged sheet was firmly pressed into face-to-face contact with the intermediate sheet adhesive surface and the proofing sheet carrier film peeled away. Each of the cyan, yellow, and magenta imaged sheets were similarly transferred in register with intermediate removal of each respective carrier sheet except that of the finally positioned magenta image layer which temporarily served as a protective cover for the then completed four-color proof reproduction.

After thorough examination of the four-color composite transparency on a light table in order to test the quality of dot definition and the like, the final carrier sheet was peeled from the composite and the exposed adhesive surface was firmly pressed into contact with the surface of the ultimate printing stock to firmly adhere the composite to the paper sheet. The film carrier of the intermediate sheet was then peeled from the composite leaving a matte finish print having a sharply-defined faithful reproduction of the original subject matter in a vivid print fully representative of the actual lithographic print to be obtained from the set of color separation negatives.

Although the foregoing examples have set out embodiments of the present invention in which the photosensitive resist layer composition includes a film-forming polymeric component of some substantial physical strength, such as the novolak resin components which are widely used in commercially available photoresist products, it is not necessary that these strong film-formers be utilized. Sufficient photoresist, or photomask, continuity and integrity may be obtained even when this layer consists essentially of the photosensitive component, without further addition of a film-forming resinous component. The following evidences the efficacy of such a more simple embodiment of the invention.

EXAMPLE 5

A 75 μm sheet of polyester film was whirl coated with a layer of the polyisobutylene pressure-sensitive adhesive composition, as in Example 3, and that adhesive layer was then whirl coated at 400 rpm with a 5% solution of naphthoquinone-(1,2)-diazide-(2)-5-sulfonic acid diester of bisphenol A in methyl ethyl ketone and dried for about three minutes at 80° C. in a circulating air oven.

The resulting sheet was image-wise exposed to a separation negative, as in the foregoing examples, and was developed with a 2% aqueous solution of trisodium phosphate. When washed with tap water and dried, the sheet provided open window areas of access to the underlying adhesive layer, as earlier described with those compositions including the preferable resinous film-former component. The sheet thus imaged was nonetheless capable of receiving a powdered pigment coloring to reveal a sharply defined image of the original light exposure. In the manner previously described the sheet was further capable of being "fixed" by overall light exposure and redevelopment in the alkaline solution.

What is claimed is:

1. The method of forming an image which comprises:
providing imaging sheet material comprising a carrier sheet having a composite coating thereon comprising a layer of a pressure-sensitive adhesive and a layer of a photoresist composition coated upon said adhesive layer;
image-wise exposing said photoresist layer to actinic radiation, thereby effecting an image-wise change in developer fluid solubility of said photoresist layer;
contacting said exposed photoresist layer with said developer fluid and removing from said layer the more soluble areas thereof, thereby forming open-window areas in said photoresist layer through which are accessible like areas of the underlying adhesive layer defining the exposure image;
applying to at least said accessible adhesive layer areas of said sheet material a finely-divided powder, whereby powder adhering to said accessible areas renders said image perceptively distinct; and
removing from the resulting imaged sheet material the residual portions of said photoresist layer, thereby rendering accessible the remaining non-imaged adhesive surface areas of said adhesive layer.

2. The method according to claim 1 wherein said photoresist composition is positive-working, becoming soluble in said developer fluid upon exposure to said actinic readiation, and wherein said removal of residual photoresist layer portions comprises:
exposing, subsequent to said open-window area forming step, said residual portions of said photoresist layer to said actinic radiation; and
contacting, subsequent to said powder applying step, said exposed residual portions of said photoresist layer with said developer fluid and removing the thus solubilized residual portions from the imaged sheet material.

3. The method according to claim 1 which further comprises:
pressing said accessible non-imaged adhesive surface areas into adhesive contact with a receiving surface.

4. The method of forming an image on a receiving surface which comprises:
forming an imaged sheet according to the method of claim 1 wherein the face surface of said carrier sheet exhibits a low adherend property and is in contact with said adhesive layer;
pressing said accessible non-imaged adhesive surface areas into intimate contact with said receiving surface and forming a bond there-between which is greater than the bond between said carrier sheet face surface and said adhesive layer; and
separating said carrier sheet from said adhesive layer, thereby transferring said image to said receiving surface.

5. The method of forming an image on a receiving surface which comprises:
forming an imaged sheet according to the method of claim 1 wherein the face surface of said imaging material carrier sheet exhibits a low adherend property and said imaging material further comprises a stripping layer of film-forming polymeric material coated on said carrier sheet face surface and underlying said adhesive layer, the bond between said adhesive and stripping layers being greater than the bond between said stripping layer and said carrier sheet face surface;
pressing said accessible non-imaged adhesive surface areas into intimate contact with said receiving surface and forming a bond there-between which is greater than the bond between said carrier sheet face surface and said stripping layer; and separating said carrier sheet from said stripping layer, thereby transferring to said receiving surface the image-bearing adhesive layer of said imaging material with an overlying protective stripping layer.

6. The method of forming a multi-color proofing image which comprises:

forming at least one imaged sheet according to the method of claim 1 wherein the face surface of said imaging material carrier sheet exhibits a low adherend property and is in contact with said adhesive layer, utilizing an image-wise exposure effected by means of at least a first color separation negative and applying a powder of at least a first color;

forming an additional imaged sheet according to the method of claim 1 wherein the face surface of said imaging material carrier sheet exhibits a low adherend property and said imaging material further comprises a stripping layer of film-forming polymeric material coated on said carrier sheet face surface and underlying said adhesive layer, the bond between said adhesive and stripping layers being greater than the bond between said stripping layer and said carrier sheet face surface, utilizing an image-wise exposure effected by means of an additional color separation negative and applying a powder of an additional color;

providing a receptor sheet;

pressing said accessible non-imaged adhesive surface areas of said at least one imaged sheet into adhesive contact with said receptor sheet;

separating the carrier sheet from the adhesive layer of said at least one imaged sheet, thereby transferring the imaged adhesive layer of said at least one sheet to said receptor sheet;

pressing said accessible non-imaged adhesive surface areas of said additional imaged sheet into image-registered adhesive contact with the transferred at least one imaged adhesive layer; and separating the carrier sheet from the stripping layer of said additional imaged sheet, thereby transferring the imaged adhesive layer of said additional sheet to said receptor and completing said multi-color proofing image with an overlying protective stripping layer.

7. The method according to claim 6 wherein said at least one imaged sheet comprises a plurality of imaged sheets formed by utilizing a like plurality of different separation negatives and different colored powders, and wherein each of the imaged adhesive layers of said plurality of sheets is transferred to said receptor sheet seriatim in register with the preceding transferred imaged layer.

8. The method of forming a multi-color proofing image which comprises:

forming a plurality of images, each on a separate sheet, according to the method of claim 1 wherein the face surface of said imaging material carrier sheet exhibits a low adherend property and is in contact with said adhesive layer, in respect of each of said plurality utilizing an image-wise exposure effected by means of a different color separation negative and applying a powder of a different color;

providing a first receptor sheet comprising:
(a) a support sheet, and
(b) a stripping layer of film-forming polymeric material coated on said support sheet,
(c) the bond between said support sheet and stripping layer being greater than the bond between said imaging material carrier sheet and adhesive layer;

pressing said accessible non-imaged adhesive surface areas of a first of said plurality of sheets into intimate contact with said first receptor sheet thereby forming a bond between said receptor sheet stripping layer and said first imaged layer which is greater than that between said carrier sheet face surface and adhesive layer;

separating said carrier sheet from said adhesive layer, thereby transferring said adhesive layer with the first of said plurality of images to said receptor sheet;

transferring, in like manner, the remainder of said plurality of images to the accessible adhesive surface and in register with the image of each preceding transferred image layer, thereby forming a multi-color composite image;

providing a second receptor sheet;

pressing the accessible adhesive surface of the last of said plurality of transferred imaged layers into intimate contact with said second receptor sheet and forming a bond therebetween which is greater than the bond between said first receptor sheet support and stripping layer and;

separating said support sheet from said stripping layer, thereby transferring to said second receptor sheet said multi-color composite image with an overlying protective stripping layer.

* * * * *